(12) United States Patent
Verma et al.

(10) Patent No.: US 8,937,845 B2
(45) Date of Patent: Jan. 20, 2015

(54) MEMORY DEVICE REDUNDANCY MANAGEMENT SYSTEM

(71) Applicant: Freescale Semiconductor, Inc., Austin, TX (US)

(72) Inventors: Chetan Verma, Noida (IN); Piyush Kumar Mishra, Noida (IN); Ashish Sharma, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 281 days.

(21) Appl. No.: 13/665,917

(22) Filed: Oct. 31, 2012

(65) Prior Publication Data

US 2014/0119131 A1 May 1, 2014

(51) Int. Cl.
| | | |
|---|---|---|
| G11C 29/04 | (2006.01) | |
| G11C 29/12 | (2006.01) | |
| G11C 29/24 | (2006.01) | |
| G11C 11/4193 | (2006.01) | |

(52) U.S. Cl.
USPC ...... 365/200; 365/189.02; 365/201; 365/226; 365/227; 714/710; 714/711

(58) Field of Classification Search
USPC ............... 365/189.02, 200, 201, 226, 227; 714/710, 711
See application file for complete search history.

(56) References Cited

U.S. PATENT DOCUMENTS

| | | | |
|---|---|---|---|
| 5,262,993 A * | 11/1993 | Horiguchi et al. | 365/200 |
| 5,691,952 A * | 11/1997 | Sasaki et al. | 365/230.08 |
| 6,092,160 A | 7/2000 | Marsters | |
| 6,553,510 B1 * | 4/2003 | Pekny | 714/6.12 |
| 6,618,299 B2 | 9/2003 | Sohn | |
| 6,745,354 B2 | 6/2004 | Terzioglu | |
| 7,047,455 B2 | 5/2006 | Roohparvar | |
| 7,168,013 B2 | 1/2007 | Roohparvar | |
| 7,710,800 B2 | 5/2010 | Linzer | |
| 7,995,407 B2 * | 8/2011 | Maki | 365/200 |
| 2008/0270826 A1 * | 10/2008 | Shaw et al. | 714/6 |
| 2008/0270828 A1 | 10/2008 | Wienchol | |
| 2009/0049351 A1 * | 2/2009 | Norrod et al. | 714/723 |

* cited by examiner

*Primary Examiner* — J. H. Hur
(74) *Attorney, Agent, or Firm* — Charles Bergere

(57) ABSTRACT

A system for managing redundancy in a memory device includes memory arrays and associated periphery logic circuits, and redundant memory arrays and associated redundant periphery logic circuits. The memory arrays and a first set of logic circuits associated with the periphery logic circuits corresponding to the memory arrays are connected to the power supply by way of memory I/O switches. The redundant memory arrays and associated redundant periphery logic circuits are connected to the power supply by way of redundant I/O switches. The memory and redundant I/O switches are switched on/off based on an acknowledgement signal generated during a built-in-self-test (BIST) operation of the memory device.

16 Claims, 4 Drawing Sheets

MEMORY DEVICE REDUNDANCY MANAGEMENT SYSTEM

BACKGROUND OF THE INVENTION

The present invention relates generally to memory devices, and, more particularly, to a system for redundancy management in a memory device.

Conventional memory devices including static random access memory (SRAM) devices include multiple memory cells arranged as memory input/outputs (I/Os). Each memory I/O has an array logic circuit and a corresponding periphery logic circuit that enables an external device, such as a microprocessor, to access the array logic circuit for reading and writing data. The periphery logic circuit includes read and write latches (among other elements) to read and write data bits to the memory array. Additionally, the memory device includes redundant memory cells arranged as redundant memory I/Os. Similar to the memory I/O, each redundant memory I/O has a corresponding redundant periphery logic circuit that functions similar to the periphery logic circuit. The redundant memory arrays and the redundant periphery logic circuit replace the memory I/O if a defect is detected in the memory I/O. A built-in self-test (BIST) circuitperforms a BIST operation on the memory device to identify defective memory I/Os. Upon completion of the BIST operation, an acknowledgment signal is generated and decoded by redundancy decoders to identify and replace the defective memory array and corresponding periphery logic circuit with a functional redundant memory array and corresponding redundant periphery logic circuit.

When data bits are received by the memory device for storing in the defective memory array, the memory device shifts the data bits and stores them in the substitute redundant memory array. The data bits are shifted from the periphery logic circuit associated with the defective memory array by way of one or more periphery logic circuits associated with one or more memory arrays until they are received by the redundant periphery logic circuit and stored in the redundant memory array.

Though existing memory devices have built-in systems to switch off the defective memory I/O, circuits associated with the periphery logic circuit remain powered up and continue consuming leakage power. Further, the redundant memory array and corresponding redundant periphery logic circuit also are powered when not in use. The combined power consumption of the periphery logic circuit of the defective memory I/O and the unused redundant memory array and redundant periphery logic circuit contributes to a substantial portion of the power budget of memory devices, which is particularly critical in nanometer, low-power-process technologies.

Therefore, it would be advantageous to have a system for managing redundancy in a memory device that reduces the leakage power, reduces the power budget of the memory device, and overcomes the above-mentioned limitations of conventional redundancy management systems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
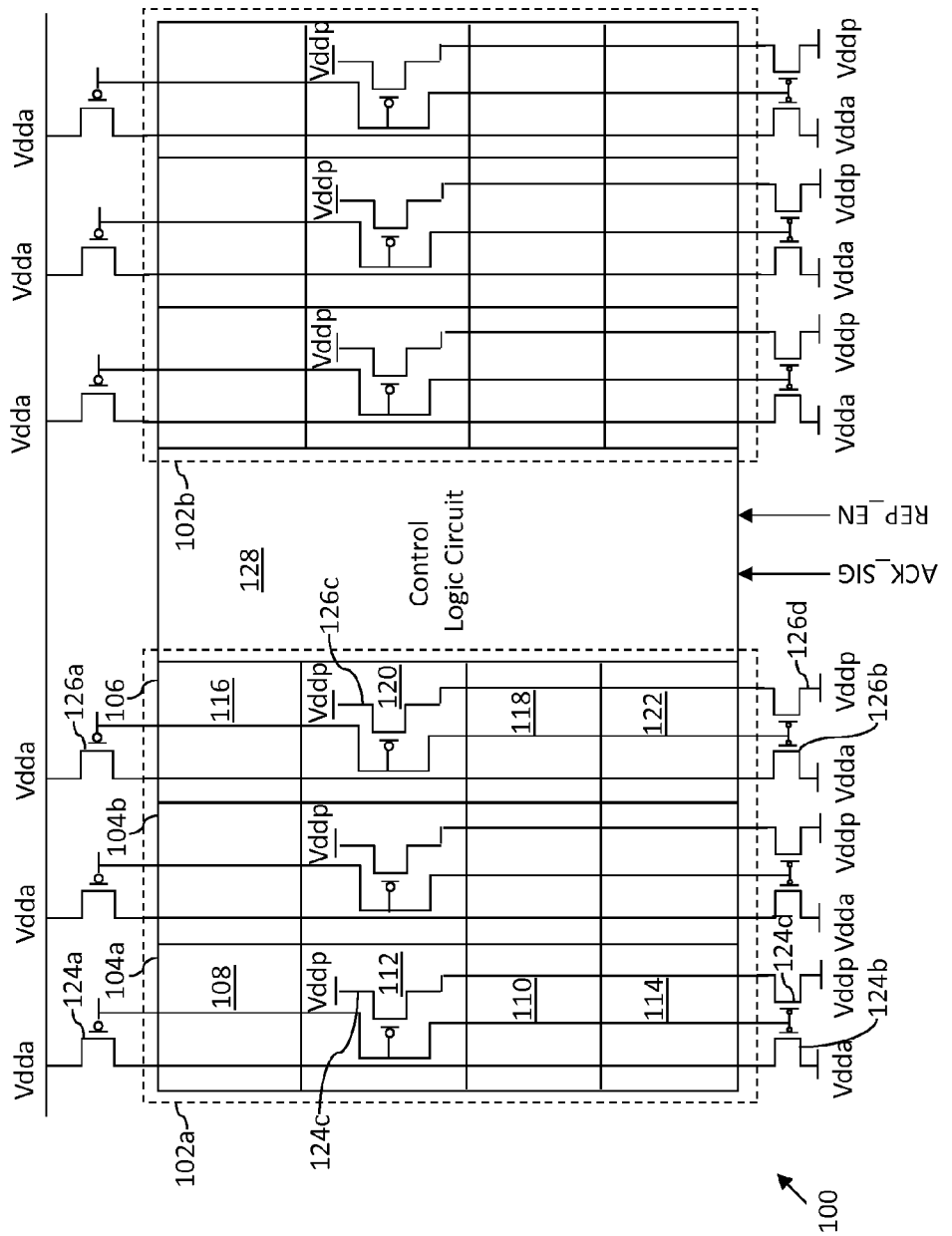
FIG. 1 is a schematic block diagram illustrating a system for managing redundancy in a memory device in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the terms multiplexer and mux are used interchangeably.

In an embodiment of the present invention, a system for managing redundancy in a memory device operating on a power supply is provided. The memory device includes a first memory array and a first periphery logic circuit associated therewith, and at least one redundant memory array and a redundant periphery logic circuit associated therewith. The first periphery logic circuit includes first and second logic circuits, and the second logic circuit includes first and second sets of logic circuits. The system further includes a memory I/O switch, connected to the power supply, the first memory array, and the first periphery logic circuit. The memory I/O switch is switched on during a built-in-self-test (BIST) operation of the memory device for detecting at least one defect in the first memory array and switched off for disabling a supply of power to the first memory array, the first logic circuit, and the first set of logic circuits, based on the detection of the at least one defect.

The system further includes a redundant I/O switch, connected to the power supply, the redundant memory array, and the redundant periphery logic circuit. The redundant I/O switch is switched on when the redundant memory array and the redundant periphery logic circuit are substituted for the first memory array and the first periphery logic circuit, respectively, based on the detection of the at least one defect, and switched off when the redundant memory array and the redundant periphery logic circuit are not in use.

Further, the second set of logic circuits is connected to the power supply to receive a continuous supply of power therefrom to enable shifting of data stored in the first memory array to the redundant memory array, based on the detection of the at least one defect.

In another embodiment of the present invention, a memory device is provided. The memory device includes a first memory array for storing data and a first periphery logic circuit associated with the first memory array. The first periphery logic circuit includes first and second logic circuits, and the second logic circuit includes first and second sets of logic circuits. The memory device further includes at least one redundant memory array and a redundant periphery logic circuit associated with at least one redundant memory array.

The memory device further includes a memory I/O switch, connected to the power supply, the first memory array, and the first periphery logic circuit. The memory I/O switch is switched on during a built-in-self-test (BIST) operation of the memory device for detecting at least one defect in the first memory array and switched off for disabling a supply of power to the first memory array, the first logic circuit, and the first set of logic circuits, based on the detection of the at least one defect. The memory device further includes a redundant I/O switch, connected to the power supply, the redundant memory array, and the redundant periphery logic circuit. The redundant I/O switch is switched on when the redundant memory array and the redundant periphery logic circuit are substituted for the first memory array and the first periphery logic circuit, respectively, based on the detection of the at least one defect, and switched off when the redundant memory array and the redundant periphery logic circuit are not in use.

Further, the second set of logic circuits is connected to the power supply to receive a continuous supply of power therefrom to enable shifting of data stored in the first memory array to the redundant memory array, based on the detection of the at least one defect.

Various embodiments of the present invention provide a system for managing redundancy in a memory device. The memory device operates on a power supply. The system includes memory arrays and corresponding periphery logic circuits, and redundant memory arrays and corresponding redundant periphery logic circuits. Each memory array, a first logic circuit, and a first set of logic circuits associated with the periphery logic circuit of the memory array are connected to the power supply by way of the memory I/O switch. The memory I/O switch disables the power supply to the memory array, the first logic circuit, and the first set of logic circuits when a defect is detected in the memory array, which prevents consumption of leakage power. Further, the redundant memory arrays and corresponding redundant periphery logic circuits are connected to the power supply by way of redundant I/O switches which disable the power supply to the redundant memory arrays and corresponding redundant periphery logic circuits when not in use, which prevents consumption of leakage power. When the defect is detected in either of the memory arrays, the redundant memory arrays and corresponding redundant periphery logic circuit are enabled. The redundant I/O switches are switched on to provide power to redundant memory arrays and redundant periphery logic circuits for enabling their operation. A second set of logic circuits associated with the periphery logic circuit of a defective memory array receives a continuous supply of power to enable shifting of data bits between the defective memory I/Os and the redundant memory I/Os.

Referring now to FIG. 1, a schematic block diagram illustrating a memory device 100, in accordance with an embodiment of the present invention, is shown. The memory device 100 includes first and second memory portions 102a and 102b. The first memory portion 102a includes first and second memory combinations 104a and 104b, and a redundant memory combination 106. The first memory combination 104a includes first and second memory arrays 108 and 110, a first bit unit 112, and a first data input/output (I/O) 114. The redundant memory combination 106 includes first and second redundant memory arrays 116 and 118, a second bit unit 120, and a second data I/O 122. The second memory combination 104b is similar to the first memory combination 104a. The memory device 100 further includes first through fourth memory I/O switches 124a-124d, first through fourth redundant I/O switches 126a-126d, and a control logic circuit 128.

The first and second memory arrays 108 and 110 store data, as is known by those of skill in the art. In an embodiment of the present invention, the memory device 100 may be a random access memory (RAM), a flash memory, a dynamic random access memory (DRAM), a static random access memory (SRAM), a synchronous dynamic random access memory (SDRAM), a single-data rate (SDR) SDRAM, or a double-data rate DDR SDRAM. Data bits are written to and read from the first and second memory arrays 108 and 110 by way of the first bit unit 112 (also known as first logic circuit) and the first data I/O 114 (also known as second logic circuit). The first data I/O 114 and the first bit unit 112 are a part of a periphery logic circuit associated with the first and second memory arrays 108 and 110. It will be apparent to a person skilled in the art that each memory array, such as the memory arrays 108 and 110, includes a corresponding periphery logic circuit that includes a bit unit and a data I/O unit that enable reading/writing data from/to the memory array. The first and second memory arrays 108 and 110 are connected to a first power supply Vdda by way of the first and second memory I/O switches 124a and 124b. In an embodiment of the present invention, the first and second memory I/O switches 124a and 124b include first and second memory array switches that connect the first and second memory arrays 108 and 110 to the first power supply Vdda.

The first bit unit 112 and a first set of logic circuits (see FIGS. 3 and 4) associated with the first data I/O 114 are connected to a second power supply Vddp by way of the third and fourth memory I/O switches 124c and 124d. In an embodiment of the present invention, the third and fourth memory I/O switches 124c and 124d include first and second memory periphery logic switches that connect the first bit unit 112 and the first set of logic circuits associated with the first data I/O 114 to the second power supply Vddp. A second set of logic circuits (see FIGS. 3 and 4) associated with the first data I/O 114 is directly connected to the second power supply Vddp for receiving a continuous supply of power. The redundant memory combination 106 is used to substitute for either of the first and second memory combinations 104a and 104b upon detecting a defect in the first or second memory combinations 104a, 104b. The first and second redundant memory arrays 116 and 118 are connected to the first power supply Vdda by way of the first and second redundant I/O switches 126a and 126b, and the second bit unit 120 and the second data I/O 122 are connected to the second power supply Vddp by way of the third and fourth redundant I/O switches 126c and 126d.

In an embodiment of the present invention, the first and second redundant I/O switches 126a and 126b include first and second redundant array switches that connect the first and second redundant memory arrays 116 and 118 to the first power supply Vdda. The third and fourth redundant I/O switches 126c and 126d include first and second redundant periphery logic switches that connect the second bit unit 120 and the second data I/O 122 to the second power supply Vddp. When the redundant memory combination 106 is unused, the first through fourth redundant I/O switches 126a-126d are switched off to prevent the redundant memory combination 106 from consuming leakage power.

If a defect is detected in either of the first and second memory arrays 108 and 110, an acknowledgement signal (ACK_SIG) and a repair enable signal (REP_EN) are generated by a defect detection system (not shown) of the memory device 100 that are transmitted to the control logic circuit 128. In an embodiment of the present invention, a built-in-self-test (BIST) operation is performed by a BIST engine of the memory device 100 to detect any defect in the first and second memory combinations 104a and 104b. Since BIST engines for memory arrays are known by those of skill in the art, the BIST engine is not shown or describe in any more detail than necessary to explain the invention. The control logic circuit 128 transmits the acknowledgement and repair enable signals ACK_SIG and REP_EN to the first data I/O 114 associated with the first and second memory arrays 108 and 110. A redundancy decoder (not shown) associated with the first data I/O 114 detects a logic high state of the repair enable signal REP_EN and decodes the acknowledgement signal ACK_SIG to identify an address of one of the first and second defective memory arrays 108 and 110. Upon decoding the address, the supply of power to the first and second memory arrays 108 and 110, the first bit unit 112, and the first set of logic circuits is disabled. The redundancy decoder further generates a shift enable signal (SHIFT_EN) after decoding the address of the defective memory array and the corresponding periphery logic circuit. The shift enable signal SHIFT_EN signals cause shifting of the data bits from the defective memory array, i.e., either of the first and second memory arrays 108 and 110 to redundant memory arrays, i.e., the first and second redundant memory arrays 116 and 118. The first through fourth redundant I/O switches 126a-126d are switched on to store data bits that are shifted from the first and second memory arrays 108 and 110 to the first and second redundant memory arrays 116 and 118 by way of the data I/Os associated with intermediate memory arrays such as the second memory combination 104b. Since, the data bits are transmitted from the first and second memory arrays 108 and 110 by way of the first data I/O 114, the second set of logic circuits receives continuous supply of power from the second power supply Vddp. Since, multiple logic circuits (the first bit unit 112, and the first set of logic circuits) associated with the periphery logic circuit of the defective memory I/O, i.e., the first and second memory arrays 108 and 110 are switched off, power consumption of the memory device 100 is reduced considerably.

Figure 2:
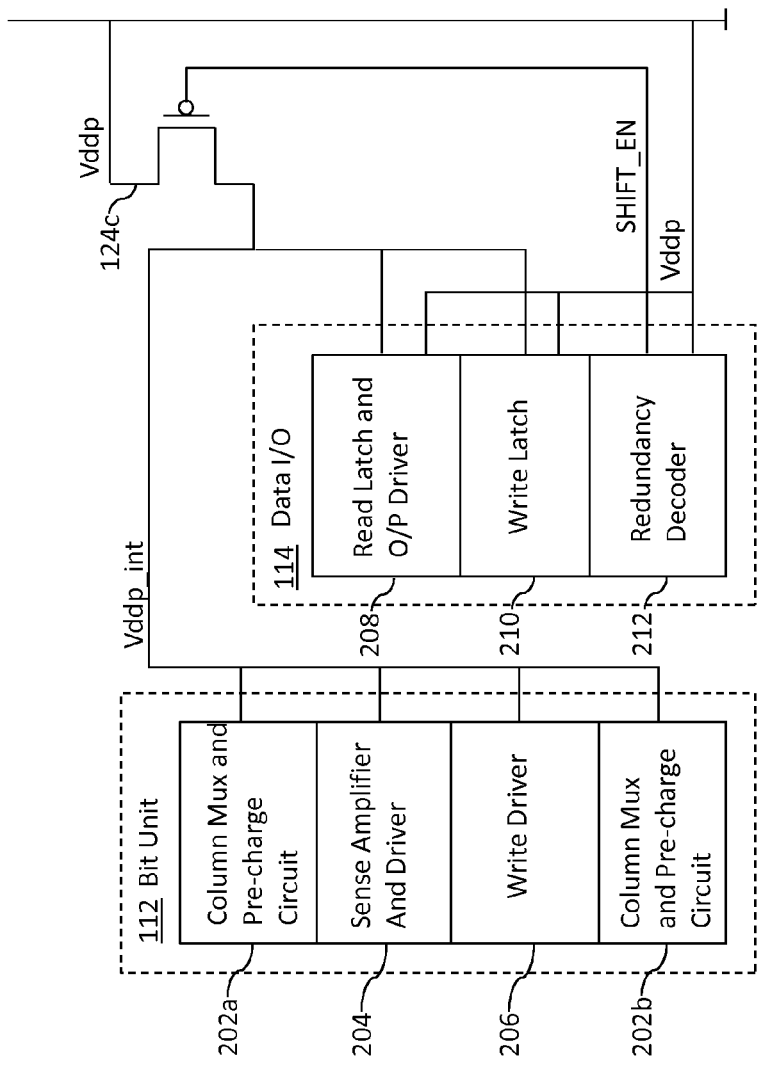
FIG. 2 is a schematic block diagram illustrating a periphery logic circuit in accordance with an embodiment of the present invention.

Referring now to FIG. 2, a schematic block diagram illustrating a periphery logic circuit 200 associated with the first and second memory arrays 108 and 110 in detail, in accordance with an embodiment of the present invention, is shown. The periphery logic circuit 200 includes the first bit unit 112, the first data I/O 114, and the third memory I/O switch 124c. The first bit unit 112 includes first and second column mux and precharge circuits 202a and 202b, a sense amplifier and driver 204, and a write driver 206. The first data I/O 114 includes a read latch and output driver 208, a write latch 210, and a redundancy decoder 212.

The first bit unit 112 is connected to the second power supply Vddp by way of the third memory I/O switch 124c. The first set of logic circuits associated with the read latch and output driver 208 and the write latch 210 are connected to the second power supply Vddp by way of the third memory I/O switch 124c. The first set of logic circuits are not critical for shifting data bits from the first and second memory arrays 108 and 110 to the first and second redundant memory arrays 116 and 118 and therefore may be disconnected from the second power supply Vddp. Switching off the third memory I/O switch 124c disables supply of power to the first bit unit 112 and the first set of logic circuits when the defect is detected in either of the first and second memory arrays 108 and 110 and considerably reduces consumption of leakage power.

The second set of logic circuits associated with the read latch and output driver 208 and the write latch 210 are directly connected to the second power supply Vddp for receiving continuous power. The second set of logic circuits enable shifting of data bits from the first and second memory arrays 108 and 110 to the first and second redundant memory arrays 116 and 118 and therefore require continuous supply of power even though the supply to the first and second memory arrays 108 and 110, the first bit unit 112, and the first set of circuits is disabled upon detecting the defect. The redundancy decoder 212 decodes the acknowledgement signal ACK_SIG to generate the address of the defective memory array (RED_ADD) and the shift enable signal SHIFT_EN upon detecting the defect. Therefore, the redundancy decoder 212 requires continuous supply of power and hence is connected directly to the second power supply Vddp.

Figure 3:
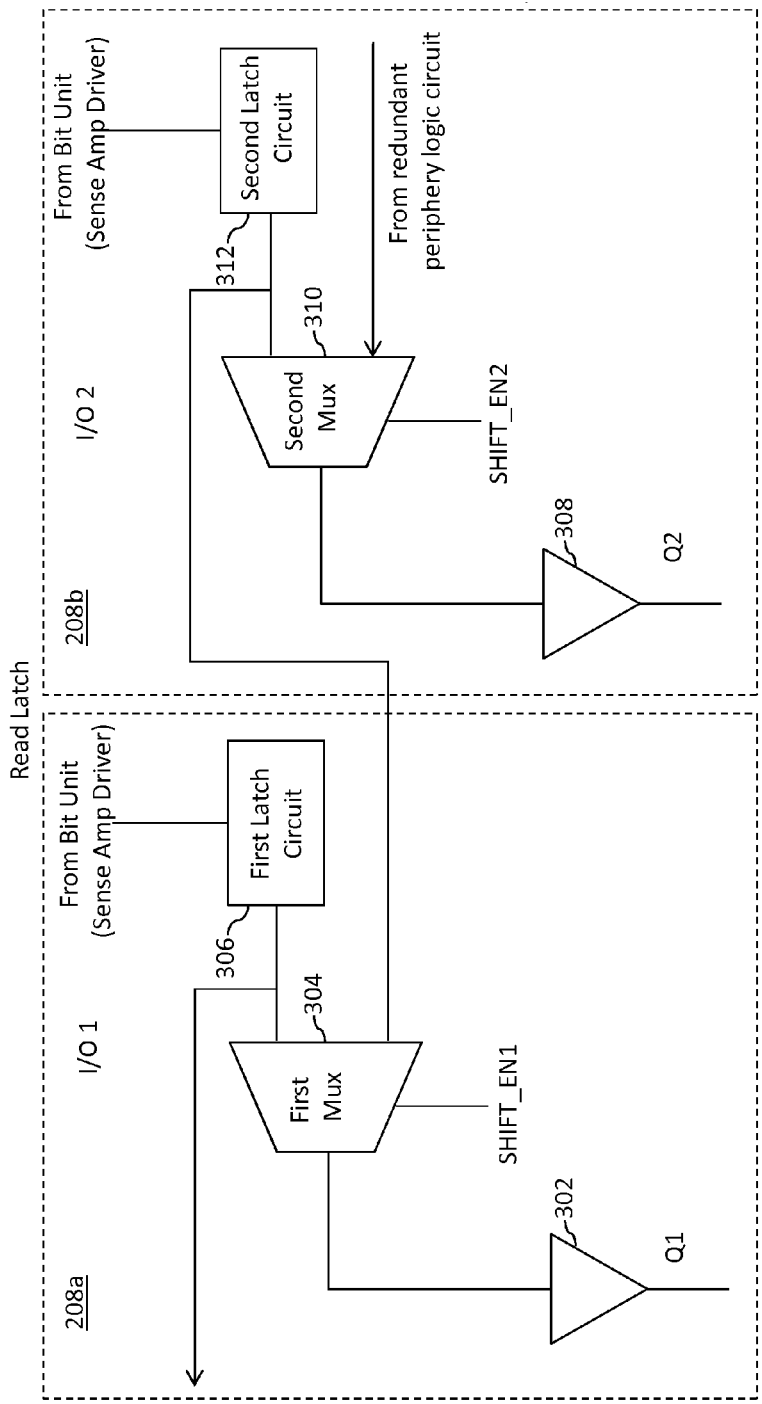
FIG. 3 is a schematic block diagram illustrating a read latch in accordance with an embodiment of the present invention.

Referring now to FIG. 3, a schematic block diagram illustrating first and second read latches and output drivers 208a and 208b, in accordance with an embodiment of the present invention, is shown. The first read latch and output driver 208a includes a first buffer circuit 302, a first mux 304, and a first latch circuit 306. The second read latch and output driver 208b includes a second buffer circuit 308, a second mux 310, and a second latch circuit 312.

The first latch circuit 306 receives an input signal from the first bit unit 112. An output terminal of the first latch circuit 306 is connected to a first input terminal of the first mux 304. A second input terminal of the first mux 304 is connected to an output terminal of the second latch circuit 312. A select input terminal of the first mux 304 receives a first shift enable signal SHIFT_EN1 from the redundancy decoder 212. An output terminal of the first mux 304 is connected to an input terminal of the first buffer circuit 302.

The second latch circuit 312 receives an input signal from a third bit unit associated with the second memory combination 104b. An output terminal of the second latch circuit 312 is connected to a first input terminal of the second mux 310. A second input terminal of the second mux 310 is connected to the second data I/O 122 adjacent to the second memory combination 104b. A select input terminal of the second mux 310 receives a second shift enable signal SHIFT_EN2 from a redundancy decoder associated with the second memory combination 104b. An output terminal of the second mux 310 is connected to an input terminal of the second buffer circuit 308.

When a defect is detected in either of the memory arrays 108 and 110, the first shift enable signal SHIFT_EN1 switches to logic high state, which causes the first mux 304 to select one or more read data bits received from the second latch circuit 312 at the second input terminal. The read data bits are shifted from the second memory combination 104b to the first memory combination 104a and transmitted to the first buffer circuit 302, which outputs the read bits at an output terminal thereof (Q1). After the shifting operation is complete, a read operation request is received by the control logic circuit 128 for the first and second memory arrays 108 and 110. Since, data bits stored in the first and second memory arrays 108 and 110 has been shifted to the redundant memory arrays 116 and 118 (upon detecting the defect), the data bits need to be shifted by way of one or more memory combinations, such as the second memory combination 104b, that are located between the first memory combination 104a and the redundant memory combination 106, when a read operation request is received corresponding to the first and second memory arrays 108 and 110.

Thus, the first mux 304 and the first buffer circuit 302 form the second set of logic circuits and are essential for the shifting operation, and are directly connected to the second power supply Vddp for receiving continuous supply of power. Further, the first latch circuit 306 is connected to the second power supply Vddp by way of the third memory I/O switch 124c. The third memory I/O switch 124c disables power supply to the first latch circuit 306 when the defect is detected in either of the memory arrays 108 and 110 and prevents consumption of leakage power.

Figure 4:
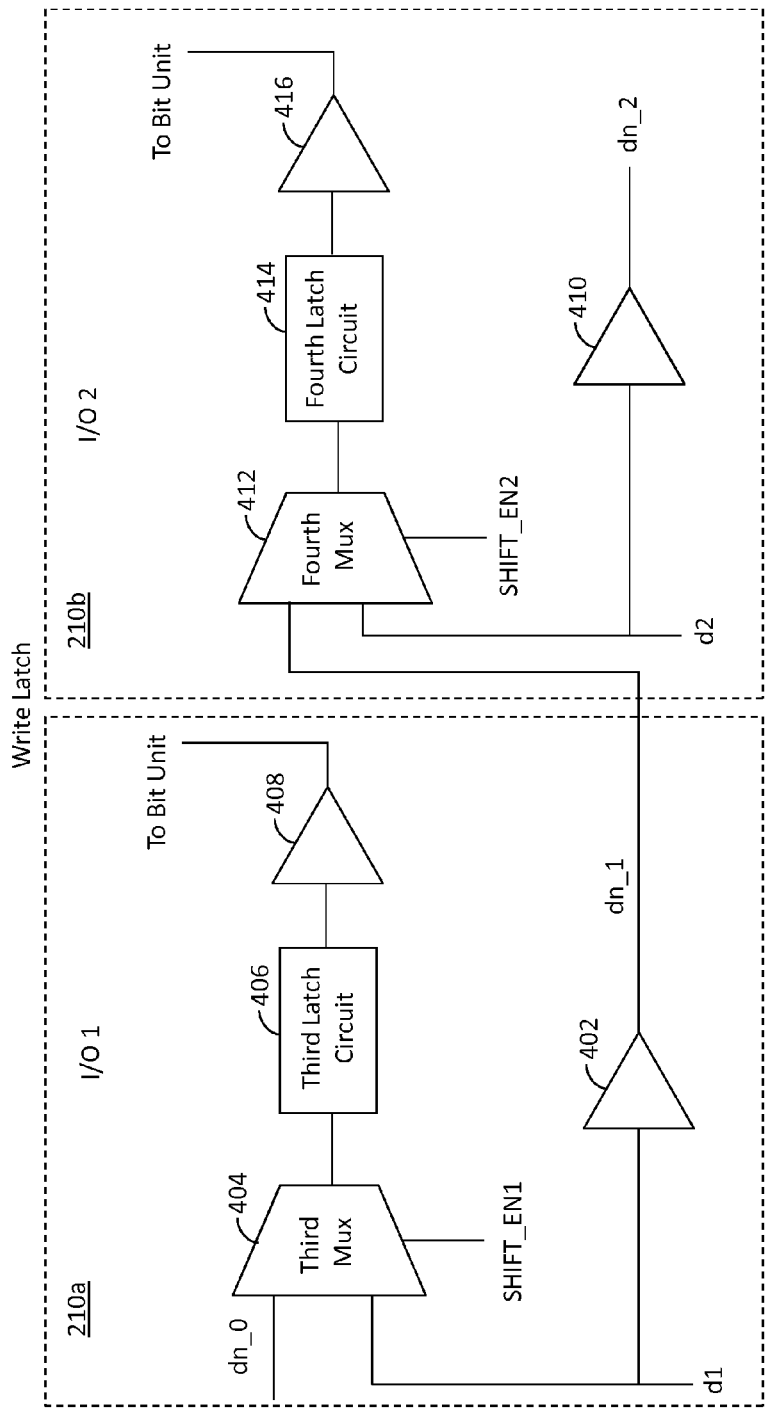
FIG. 4 is a schematic block diagram illustrating a write latch in accordance with an embodiment of the present invention.

Referring now to FIG. 4, a schematic block diagram illustrating first and second write latches 210a and 210b in detail, in accordance with another embodiment of the present invention, is shown. The first write latch 210a includes a third buffer circuit 402, a third mux 404, a third latch circuit 406, and a fourth buffer circuit 408. The second write latch 210b includes a fifth buffer circuit 410, a fourth mux 412, a fourth latch circuit 414, and a sixth buffer circuit 416. The first set of logic circuits includes the first and second latch circuits 306 and 312, the third and fourth muxes 404 and 412, the third and fourth latch circuits 406 and 414, and the fourth and sixth buffer circuits 408 and 416, respectively. The second set of logic circuits includes the first and second muxes 304 and 310, the first, second, third, and fifth buffer circuits 302, 308, 402, and 410, respectively.

A first input terminal of the third mux 404 is connected to a write latch of an adjacent memory array and periphery logic circuit for receiving one or more write data bits (dn_0) for shifting to another memory array and periphery logic circuit, such as the second memory combination 104b. A second input terminal of the third mux 404 receives one more write data bits (d1) from an external device (not shown) for writing to memory arrays associated with the first write latch 210a, i.e., the first and second memory arrays 108 and 110. A select input terminal of the third mux 404 receives the first shift enable signal SHIFT_EN1. Further, an output terminal of the third mux 404 is connected to an input terminal of the third latch circuit 406. An output terminal of the third latch circuit 406 is connected to an input terminal of the fourth buffer circuit 408 and an output terminal of the fourth buffer circuit 408 is connected to the first bit unit 112. The write data bits d1 are provided to an input terminal of the third buffer circuit 402. An output terminal of the third buffer circuit 402 is connected to an input terminal of the fourth mux 412 for transmitting the write data bits dn_1 thereto.

A second input terminal of the fourth mux 412 receives one or more write data bits d2 from an external device for being written to memory arrays associated with the second write latch 210b. A select input terminal of the fourth mux 412 receives the second shift enable signal SHIFT_EN2. An output terminal of the fourth mux 412 is connected to an input terminal of the fourth latch circuit 414. An output terminal of the fourth latch circuit 414 is connected to an input terminal of the sixth buffer circuit 416 and an output terminal of the sixth buffer circuit 416 is connected to the third bit unit. Further, the write data bits d2 are provided to an input terminal of the fifth buffer circuit 410. An output terminal of the fourth buffer circuit 402 is connected to an input terminal of the fourth mux 412.

When a defect is detected in either of the first and second memory arrays 108 and 110, the first and second shift enable signals SHIFT_EN1 and SHIFT_EN2 transition to logic high and cause the fourth mux 412 to select the write data bits dn_1 provided at the first input terminal thereof for shifting. Therefore, the data bits d1 are transmitted to the second write latch 210b for being transmitted to the redundant memory array and periphery logic circuit 106 for storage.

The third buffer circuit 402 is associated with the second set of logic circuits and is therefore essential for the shifting operation, and is directly connected to the second power supply Vddp for receiving continuous supply of power. The third mux 404, the third latch circuit 406, and the fourth buffer circuit 408 are associated with the first set of logic circuits and therefore connected to the second power supply Vddp by way of the third memory I/O switch 124c. The third memory I/O switch 124c disables power supply to the first set of logic circuits when a defect is detected in either of the memory arrays 108 and 110, which prevents leakage power consumption.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system for managing redundancy in a memory device, wherein the memory device includes a first memory array and a first periphery logic circuit associated therewith, and at least one redundant memory array and a redundant periphery logic circuit associated therewith, wherein the first periphery logic circuit includes first and second logic circuits, and wherein the second logic circuit includes first and second sets of logic circuits, the system comprising:

a memory input/output (I/O) switch, connected to a power supply, the first memory array, and the first periphery logic circuit, wherein the memory I/O switch is configured to be switched on during a memory built-in-self-test (BIST) operation for detecting at least one defect in the first memory array and switched off for disabling a supply of power to the first memory array, the first logic circuit, and the first set of logic circuits, based on the detection of the at least one defect; and a redundant I/O switch, connected to the power supply, the redundant memory array, and the redundant periphery logic circuit, wherein the redundant I/O switch is configured to be switched on when the redundant memory array and the redundant periphery logic circuit are substituted for the first memory array and the first periphery logic circuit, respectively, based on the detection of the at least one defect, and switched off when the redundant memory array and the redundant periphery logic circuit are not in use, wherein the second set of logic circuits is connected to the power supply to receive a continuous supply of power therefrom to enable shifting of data stored in the first memory array to the redundant memory array, based on the detection of the at least one defect, wherein the second logic circuit includes at least one of a read latch, an output driver, a write latch, and a redundancy decoder, and wherein the read latch includes:

a first latch circuit connected to the power supply by way of the memory I/O switch and having a data input terminal connected to the first logic circuit, wherein the memory I/O switch disables a supply of power to the first latch circuit based on the detection of the at least one defect;

a first multiplexer having a first input terminal connected to an output terminal of the first latch circuit, a second input terminal connected to an output terminal of a second latch circuit corresponding to a second periphery logic circuit associated with a second memory array, and a select terminal for receiving a shift enable signal, wherein the first multiplexer selectively outputs at least one of the outputs of the first and second latch circuits at an output terminal thereof; and a first buffer circuit having an input terminal connected to the output terminal of the first multiplexer and an output terminal that generates a read output of the first memory array, wherein the first multiplexer and the first buffer circuit are connected to the power supply for receiving the continuous supply of power.

2. The system of claim 1, wherein the first logic circuit includes at least one of a column multiplexer, a sense amplifier, a sense amplifier driver, and a write driver.

3. The system of claim 1, wherein the write latch includes:
a second multiplexer having a first input terminal connected to an output terminal of a second buffer circuit associated with the second periphery logic circuit, a second input terminal for receiving a data input signal, and a select terminal for receiving the shift enable signal, wherein the second multiplexer selectively provides at least one of an output of the second buffer circuit and the data input signal at an output terminal thereof;
a third latch circuit having a data input terminal connected to the output terminal of the second multiplexer;
a third buffer circuit having an input terminal connected to an output terminal of the third latch circuit and an output terminal connected to the first logic circuit, wherein the second multiplexer, the third latch circuit, and the third buffer circuit are connected to the power supply by way of the memory I/O switch, and wherein the memory I/O switch disables a supply of power to the second multiplexer, the third latch circuit, and the third buffer circuit based on the detection of the at least one defect; and
a fourth buffer circuit having an input terminal for receiving the data input signal and an output terminal connected to a third multiplexer associated with a third periphery logic circuit of a third memory array, wherein the fourth buffer circuit is connected to the power supply for receiving the continuous supply of power.

4. The system of claim 3, wherein the switching of the memory and redundant I/O switches is controlled by an acknowledgement signal generated during the BIST operation.

5. The system of claim 4, wherein the redundancy decoder decodes the acknowledgement signal to generate the shift enable signal.

6. The system of claim 4, wherein the redundancy decoder is connected to the power supply for receiving the continuous supply of power.

7. The system of claim 3, wherein the second set of logic circuits includes the first multiplexer, the first and fourth buffer circuits, and the redundancy decoder.

8. The system of claim 3, wherein the first set of logic circuits includes the first latch circuit, the second multiplexer, the third latch circuit, and the third buffer circuit.

9. A memory device, comprising:
a first memory array for storing data;
a first periphery logic circuit associated with the first memory array, wherein the first periphery logic circuit includes first and second logic circuits, and wherein the second logic circuit includes first and second sets of logic circuits;
at least one redundant memory array;
a redundant periphery logic circuit associated with the at least one redundant memory array;
a memory I/O switch, connected to a power supply, the first memory array, and the first periphery logic circuit, wherein the memory I/O switch is switched on during a built-in-self-test (BIST) operation of the memory device for detecting at least one defect in the first memory array and switched off for disabling a supply of power to the first memory array, the first logic circuit, and the first set of logic circuits based on the detection of the at least one defect; and
a redundant I/O switch, connected to the power supply, the redundant memory array, and the redundant periphery logic circuit, wherein the redundant I/O switch is switched on when the redundant memory array and the redundant periphery logic circuit are substituted for the first memory array and the first periphery logic circuit, respectively, based on the detection of the at least one defect, and switched off when the redundant memory array and the redundant periphery logic circuit are not in use,
wherein the second set of logic circuits is connected to the power supply to receive a continuous supply of power therefrom to enable shifting of data stored in the first memory array to the redundant memory array, based on the detection of the at least one defect,
wherein the second logic circuit comprises at least one of a read latch, an output driver, a write latch, and a redundancy decoder, and
wherein the read latch includes:
a first latch circuit connected to the power supply by way of the memory I/O switch and having a data input terminal connected to the first logic circuit, wherein the memory I/O switch disables a supply of power to the first latch circuit based on the detection of the at least one defect;
a first multiplexer having a first input terminal connected to an output terminal of the first latch circuit, a second input terminal connected to an output terminal of a second latch circuit corresponding to a second periphery logic circuit associated with a second memory array, and a select terminal for receiving a shift enable signal, wherein the first multiplexer selectively outputs one of the outputs of the first and second latch circuits at an output terminal thereof; and
a first buffer circuit having an input terminal connected to the output terminal of the first multiplexer and an output terminal that generates a read output of the first memory array, wherein the first multiplexer and the first buffer circuit are connected to the power supply for receiving the continuous supply of power.

10. The memory device of claim 9, wherein the first logic circuit includes at least one of a column multiplexers, a sense amplifier, a sense amplifier driver, and a write driver.

11. The memory device of claim 9, wherein the write latch includes:
a second multiplexer having a first input terminal connected to an output terminal of a second buffer circuit associated with the second periphery logic circuit, a second input terminal for receiving a data input signal, and a select terminal for receiving the shift enable signal, wherein the second multiplexer selectively provides an output of the second buffer circuit and the data input signal at an output terminal thereof;
a third latch circuit having a data input terminal connected to the output terminal of the second multiplexer;
a third buffer circuit having an input terminal connected to an output terminal of the third latch circuit and an output terminal connected to the first logic circuit, wherein the second multiplexer, the third latch circuit, and the third buffer circuit are connected to the power supply by way of the memory I/O switch, wherein the memory I/O switch disables a supply of power to the second multiplexer, the third latch circuit, and the third buffer circuit based on the detection of the at least one defect; and
a fourth buffer circuit having an input terminal that receives the data input signal and an output terminal connected to a third multiplexer associated with a third periphery logic circuit of a third memory array, wherein the fourth buffer circuit is connected to the power supply for receiving the continuous supply of power.

12. The memory device of claim 11, further comprising a BIST circuit that performs the BIST operation and generates an acknowledgement signal that controls the switching of the memory and redundant I/O switches, respectively.

13. The memory device of claim 11, wherein the second set of logic circuits includes the first multiplexer, the first and fourth buffer circuits, and the redundancy decoder.

14. The memory device of claim 11, wherein the first set of logic circuits includes the first latch circuit, the second multiplexer, the third latch circuit, and the third buffer circuit.

15. The memory device of claim 14, wherein the redundancy decoder decodes the acknowledgement signal to generate the shift enable signal.

16. The memory device of claim 9, wherein the memory device comprises at least one of a random-access memory (RAM), a flash memory, a dynamic random-access memory (DRAM), a static random-access memory (SRAM), a synchronous dynamic random-access memory (SDRAM), a single-data rate (SDR) SDRAM, and a double-data rate DDR SDRAM.

\* \* \* \* \*